United States Patent [19]
Wardrop

[11] Patent Number: 5,917,838
[45] Date of Patent: Jun. 29, 1999

[54] FAULT TOLERANT MEMORY SYSTEM

[75] Inventor: Andrew J. Wardrop, Lakeville, Minn.

[73] Assignee: General Dynamics Information Systems, Inc., Bloomington, Minn.

[21] Appl. No.: 09/003,080

[22] Filed: Jan. 5, 1998

[51] Int. Cl.[6] .................................................. H03M 13/00
[52] U.S. Cl. .................................. 371/40.12; 371/37.01; 371/37.02; 371/30
[58] Field of Search ................................. 371/40.12, 30, 371/37.2, 37.01

[56] References Cited

U.S. PATENT DOCUMENTS

| | | | |
|---|---|---|---|
| 4,317,201 | 2/1982 | Sedalis | 371/40.4 |
| 4,584,682 | 4/1986 | Shah et al. | 395/182.05 |

OTHER PUBLICATIONS

"PCM Telecommand Standard", European Space Research & Agency, Apr. 1978, pp. 1–48, Noordwijk, The Netherlands.

*Primary Examiner*—Phung M. Chung
*Attorney, Agent, or Firm*—William J. Kubida; James A. Pinto; Holland & Hart LLP

[57] ABSTRACT

A fault tolerant memory system having a triple bit error correction and quadruple bit error detection capability is disclosed using control logic coupled to multiple decoders each having single bit error correction/double bit error detection capabilities. The memory system can also be provided with a sparing system which provides an additional memory device to circumvent failures in individual memory devices. The memory system is suited for severe environments such as computing systems operating in outer space.

20 Claims, 5 Drawing Sheets

FAULT TOLERANT MEMORY SYSTEM

FIELD OF THE INVENTION

This invention relates, in general, to memory configurations for computing systems, and in particular to memory systems utilizing error correction techniques for fault tolerant operations.

BACKGROUND OF THE INVENTION

Encoding techniques are used in digital systems to provide for detection and correction of errors occurring during data processing. Such encoding techniques include, for example, the use of gray codes, Huffman encoding, or block codes. Block codes subdivide an input or source data stream into discrete blocks, and perform a particular encoding procedure on the input data. A fixed number of check digits or bits is added to the input data during message encoding which forms a transmittable codeword. These check bits are added to the input data so that errors occurring during transmission can be detected and possibly corrected. Upon receiving the transmitted codeword, a syndrome is calculated using a parity check matrix and the received codeword. The syndrome indicates which digit, if any, in the received codeword is in error and may be corrected.

One such block encoding procedure involves the use of Hamming codes. Hamming codes are binary codes which use predefined parity check matrices to provide single bit error correction capability. Hamming codes are generally not used to provide multiple bit error correction.

With respect to computer memory structures in modern computer systems, the use of Hamming codes to implement memory systems having single bit error correcting, double bit error detecting capabilities is nearly universal in the computer industry. For example, a 32 bit computer word can be used with a 7 bit Hamming codeword to correct all single bit errors of the 32 bit word, and detect all double bit errors of the 32 bit word. However, these memory systems have only single bit error correction capabilities.

Single bit, non-recurrent errors, also known as "soft errors", may be caused by relatively rare radiation effects, such as cosmic rays or trace radioactive elements in the material surrounding the memory device. Computing systems which operate in severe environments, such as outer space, can be subjected to random upset of memory bits, as well as total failures of individual memory devices. Without the shielding provided by the Earth's atmosphere, such upsets can be very common in outer space, potentially thousands per day in a 64 Mbit dynamic memory chip.

If more than two bits are in error in a codeword, a Hamming code may falsely indicate that 0 or 1 bits were in error, or may correctly indicate that there were multiple bits in error. However, an odd number of bits in error will generally cause a single bit (correctable) error indication or a multiple bit (uncorrectable) error indication. For example, if 5 bits were actually in error, a conventional error correction system based on Hamming codes may erroneously indicate that there was only 1 bit in error. Further, it is possible for an even number of bits in actual error, a conventional error correction system based on Hamming codes could falsely indicate that there is no error. Even if the Hamming code properly indicates the number of bits in error, the Hamming code can only be used to correct single bit errors.

What is needed is a fault tolerant memory system having reliable multiple bit error detection and multiple bit error correction capabilities for use in a computer system operable in severe environments.

SUMMARY OF THE INVENTION

The present invention provides a fault tolerant memory system for storing data in computing systems operable in severe environments.

In one embodiment of the invention, a memory system providing triple bit error detection and correction, as well as quadruple bit error detection, is disclosed. The system comprises a pair of decoders, a comparator, and control logic. Data is stored in memory as two Hamming encoded copies of the same data. A first decoder decodes the first copy of the data, the first decoder detecting single bit errors present in the first copy and correcting the single bit errors by providing a corrected first copy of the data. The first decoder also detects double bit errors in the first copy.

A second decoder decodes the second copy of the data, the second decoder detecting single bit errors present in the second copy and correcting the single bit errors by providing a corrected second copy of the data. The second decoder also detects double bit errors in second copy.

The comparator compares the first corrected copy to the second corrected copy and generates an output signal indicating that the first corrected copy matches the second corrected copy. The control logic, responsive to the first and second decoders and the output signal of the comparator, selects between the first corrected copy or the second corrected copy as the data to be provided to a computing system. In this manner, if the total number of errors present the first copy and the second copy is three, the present invention can still provide valid data to the computing system.

In another embodiment of the invention, a memory sparing system is provided so that a failure in one memory device can be circumvented without permanently disabling the memory system. The memory system comprises an error correction code generator, a pair of selectors, and a plurality of memory devices. The error correction code generator is provided to generate error correction codes to be encoded with the data. The plurality of data storage devices is provided comprising at least one data storage device for storing the error correction codes, at least one storage device for storing data from each data line, and at least one additional spare storage device. A first selector couples the data lines and the error correction code generator to a selectable subset of said plurality of data storage devices so that data and the error correction codes are stored in the selectable subset of said plurality of data storage devices. A second selector, coupled to the plurality of data storage devices, selects the subset of the plurality of data storage devices so that the data and the error correction codes stored in the selectable subset can be read therefrom. In this manner, a failure in one memory device can be circumvented by selecting the subset of remaining memory devices for data storage.

A computer system incorporating the features of the present invention is also disclosed.

The foregoing and other features, utilities and advantages of the invention will be apparent from the following more particular description of a preferred embodiment of the invention as illustrated in the accompanying drawings.

DETAILED DESCRIPTION OF THE PREFERRED EMBODIMENT

The present invention provides a fault tolerant memory system for use in high performance computer systems that are operable in severe environments such as outer space. The memory system includes an error correction system that has two modes: a single error correction, double error detection (SECDED) mode; and a triple error correction, quad error detection (TECQED) mode. Additionally, spare memory resources can be provided to both enhance the long term reliability of the memory system and provide access to the error correction codes for the purposes of dynamic system testing. Finally, a memory address aliasing or windowing is provided that allows simultaneous access to the installed memory using two different combinations of error correcting mode and spare resource control settings.

These three components form a memory system that is very tolerant of the random upsets of memory bits in severe environments such as space; can tolerate total failures of the individual memory devices that make up the memory system; and is adjustable to provide the optimum mixture of fault tolerance, memory capacity, and memory speed of access for a particular application.

The data stored in the memory system uses Hamming codes so that when the data is read from the memory, any erroneous data can be detected, and corrected if appropriate. It is assumed that each piece of data is stored in the memory system with the check digits required by the particular Hamming code used. The particular Hamming code used is a matter of choice dependent on the performance and operating requirements of the computing system. As will be explained below, the invention can also be extended to any error detecting and correcting code.

Figure 1:
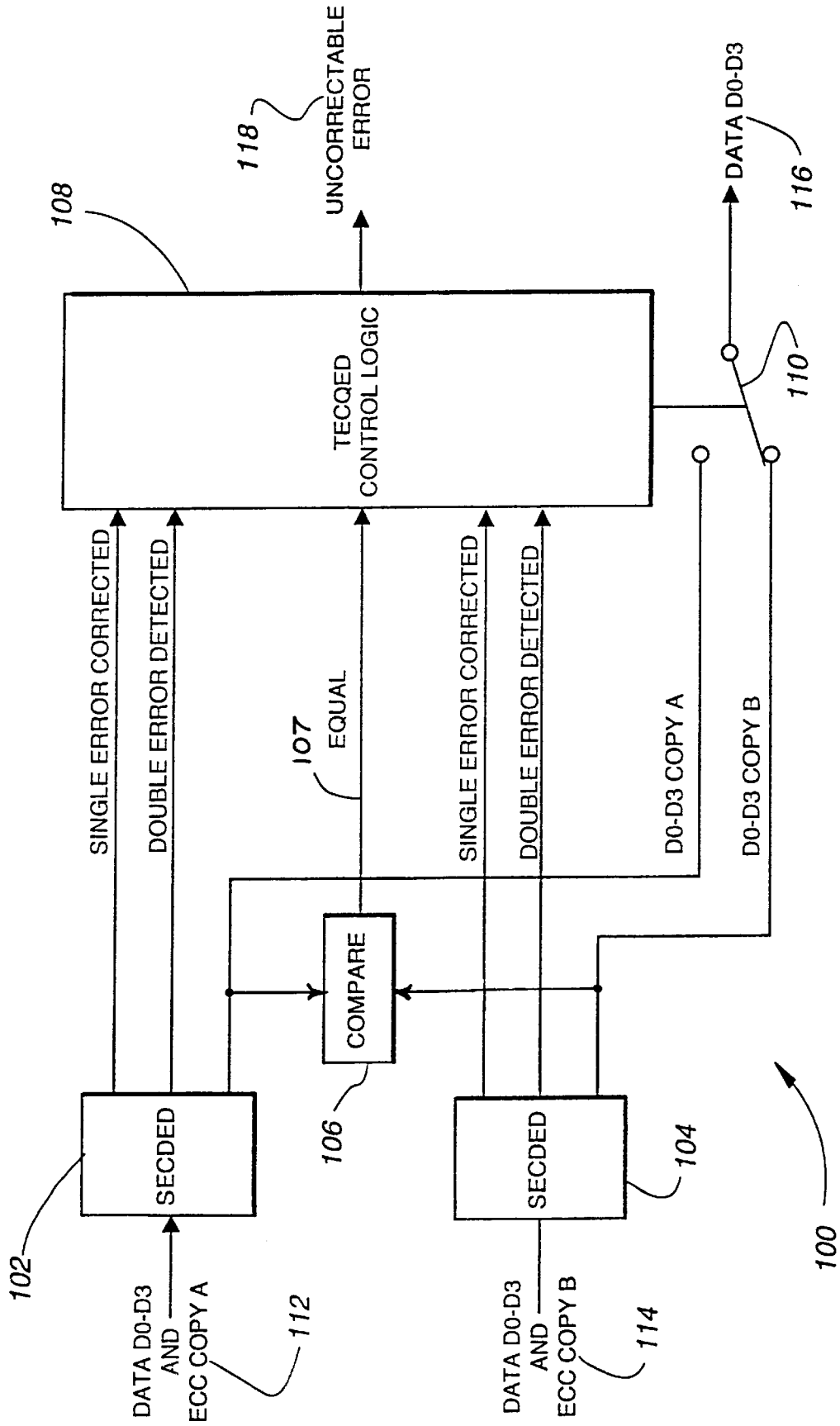
FIG. 1 illustrates a memory system having dual error correction modes in accordance with the present invention.

FIG. 1 illustrates a memory system 100 in accordance with the present invention. The memory system includes a first and second decoder module 102, 104, a comparator 106, control logic 108, and a selector 110. In accordance with the present invention, the same data is redundantly stored in the memory system as two Hamming encoded codewords 112, 114 (i.e., 2 copies of the data are stored). As will be explained below, by comparing the bit error status associated with each stored codeword as it is read from memory and decoded, more bit errors or each piece of data can be detected and corrected than if only one copy of the data was stored in memory.

The first decoder module 102 and second decoder module 104 are provided in parallel, each module implementing single error correction/double error detection based on Hamming code error detection and correction techniques. Each decoder module processes a separate copy of the exact same Hamming encoded data, shown as copy A (112) and copy B (114). It is understood, however, that each copy A or B of the same Hamming encoded data word may in fact differ if one of the copies was corrupted in memory.

Each decoder decodes the its respective copy of the encoded data and provides a status signal to the control logic indicating if no error was detected, a single bit error was detected and corrected, or double bit error was detected. If a single bit error was detected and corrected by the decoder, the decoder provides the corrected data word. If no error was detected, the decoder provides as the output the uncorrected copy of the data.

The comparator 106 compares the corrected data provided by the output of each encoder, and generates a status signal 107 to the control logic 108 if both decoder outputs are identical. The control logic 108 is responsive to the status signals generated by each decoder and the comparator, as will be explained below. The control logic 108 is coupled to a selector 110 for selecting between the copy A output of decoder 102 or the copy B output of decoder 104. This selected output 116 is provided to the computing system as the data word read from memory. The control logic also indicates if an uncorrectable error 118 is detected meaning that neither the copy A output nor the copy B output contains valid data.

The two copies of the memory words are independently processed by decoders. The data words will be corrected if either are determined to have single bit errors, and then will be compared. The single and double bit error status, as well as whether the two words agree, will be processed in the control logic, which implements the logic rules discussed herein.

While each decoder can detect and correct single bit errors, or detect double bit errors, the control logic 108 of the present invention can detect and correct triple bit errors or detect quad bit errors in a single data codeword. Table 1 shows the logic rules used by the control logic 108 to implement a triple bit error correction, quad bit error detecting memory.

TABLE 1

Triple Error Correcting Rules

| A Word Indicated Errors | B Word Indicated Errors | | |
|---|---|---|---|
| | 0 | 1 | 2 |
| 0 | Use if match | Use A | Use A |
| 1 | Use B | Use corrected if they match | Use corrected A |
| 2 | Use B | Use corrected B | Flag Error |

Table 2 shows the results of applying the rules stated in Table 1 and described herein, and the appropriate indicated errors, for all combinations of actual errors of up to 4 bit errors in a data codeword. All combinations of three or fewer bit errors are processed such that the correct data is obtained. All combinations of 4 bit errors are either corrected or an "uncorrectable" error is indicated. Five or more errors are not supported by the mechanism shown in FIG. 1.

TABLE 2

Triple Error Correction Results

| Word A | | Word B | | | | |
|---|---|---|---|---|---|---|
| Actual Errors | Indicated Errors | Actual Errors | Indicated Errors | Total Errors | Rules Application Result | Action |
| 0 | None | 0 | None | 0 | Use A or B, since they are identical | Correct |
| 1 | Corr. | 0 | None | 1 | Use B | Correct |
| 0 | None | 1 | Corr. | 1 | Use A | Correct |
| 1 | Corr. | 1 | Corr. | 2 | Use corrected A or corrected B, since they are identical | Correct |
| 2 | Uncorr. | 0 | None | 2 | Use B | Correct |
| 0 | None | 2 | Uncorr. | 2 | Use A | Correct |
| 1 | Corr. | 2 | Uncorr. | 3 | Use corrected A | Correct |
| 2 | Uncorr. | 1 | Corr. | 3 | Use corrected B | Correct |
| 0 | None | 3 | Corr. | 3 | Use A | Correct |
| 0 | None | 3 | Uncorr. | 3 | Use A | Correct |
| 3 | Corr. | 0 | None | 3 | Use B | Correct |
| 3 | Uncorr. | 0 | None | 3 | Use B | Correct |
| 0 | None | 4 | None | 4 | A and B do not agree, so indicate an error | Error detected |
| 0 | None | 4 | Uncorr. | 4 | Use A | Correct |
| 1 | Corr. | 3 | Corr. | 4 | A and B do not agree, so indicate an error | Error detected |
| 1 | Corr. | 3 | Uncorr. | 4 | Use A | Correct |
| 2 | Uncorr. | 2 | Uncorr. | 4 | Indicate error | Error detected |
| 3 | Corr. | 1 | Corr. | 4 | A and B do not agree, so indicate an error | Error detected |
| 3 | Uncorr. | 1 | Corr. | 4 | Use B | Correct |

The following logic can be used by the control logic 108 in connection with the rules shown in Table 1:

a. If 0 errors are detected in both words, use the common value if both words agree. If both words disagree, flag an uncorrectable error.

b. If one word indicates 0 errors, and the other indicates 1 error, then use the value with 0 errors indicated.

c. If 1 error is indicated in both words, correct each word, and use the common value if they agree. If they disagree, flag an uncorrectable error.

d. If either copy indicated a double error detected (i.e., uncorrectable error), then use the other copy of the data if it has 0 or 1 bit errors indicated. Use the corrected value if there was 1 bit in error.

e. If both copies detect a double bit error (i.e., uncorrectable error), then flag an uncorrectable error.

While the system shown in FIG. 1 uses two decoders in parallel, the principle is the same if a single decoder were used with two data words in sequence. The implementation using parallel decoders has the advantage of higher performance, since two memory words are accessed simultaneously.

Optionally, the memory system of FIG. 1 can selectively operate between two modes of operation. In the first mode, the memory system operates in single bit error correction/double bit error detection mode where the decoders operate to provide two data words per cycle using Hamming single bit error correction/double bit error detection decoding. The control logic 108 is essentially bypassed in this mode of operation, and thereby would have the benefit of faster processing time. This mode is referred to herein as SECDED mode.

In the second mode of operation, the memory system operates in triple bit error correction/quad bit error detection mode where the output of the decoders provides error information to the control logic 108 as described above. The control logic then processes the error information and provides appropriate data to the computing system. This mode of operation has the benefit of a greater number of errors detected and corrected than the first mode of operation. This mode is referred to herein as TECQED mode.

Hence, two data words can be read simultaneously from the memory system if the memory system is operating in single bit error correction/double bit error detection mode (SECDED); and one data word can be read from the memory system if the memory system is operating in triple bit error correction/quad bit error detection mode (TECQED).

An optional third mode of operation is also possible, with two variations. Half the memory bits are assigned to each of the two decoders, and both decoders are used in the TECQED and SECDED modes. It is also possible to use just one decoder. Since half the memory bits are assigned to each decoder, only half the memory can be accessed in this manner. Nevertheless, this can be advantageously used in cases where half the memory is unusable, either due to device failures, or if a minimum system was constructed that did not install the full memory complement, or if the memory devices were present but not powered.

Figure 2:
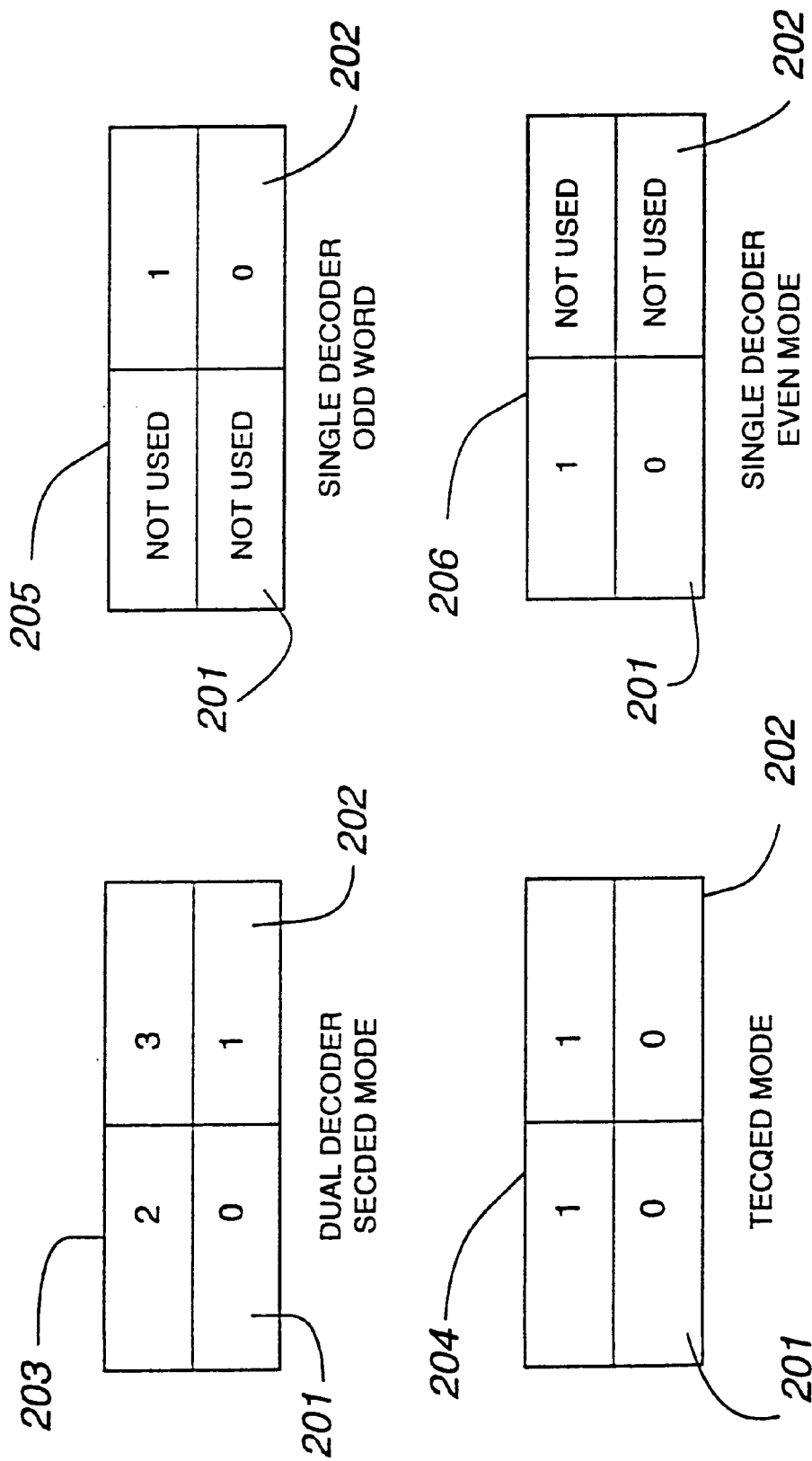
FIG. 2 illustrates an organization of a physical memory using the operable error correction modes of the memory system of FIG. 1 in accordance with the present invention.

The two variations of the single decoder mode are to use the decoder that would be servicing even addressed words in the dual decoder SECDED mode, or to use the other decoder, that would service odd addressed words in the dual decoder SECDED mode. FIG. 2 shows how data is assigned in the four data modes. Each row of every diagram represents the two words of memory that can be read and written simultaneously, one for each decoder. There are as many rows as there are double words of memory installed, but only two rows are shown. Each column represents the memory words assigned to the same decoder.

In the TECQED mode 204, the same data is written to both columns 201 and 202, so the two data words have the same address (words 0 and 1 shown). In the SECDED mode 203, the two words are different. The example shown has placed words with even addresses, such as the 0 and 2 shown, in column 201, and words with odd addresses, such as the 1 and 3 shown, in column 202.

In the single decoder odd mode 205, only the memory column 202 is used for all words, as shown for words 0 and 1. Similarly, in the single decoder even mode 206, only the memory column 202 is used for all words, as shown for words 0 and 1.

While the invention has been described herein using Hamming codes, the invention can be extended to any error detecting and correcting code. The number of bits that can be corrected using the two word method described is generally equal to the sum of the number of bits in error that can be corrected and the number of bits in error that can be corrected in a single word. For a Hamming code that can correct one error and detect two in a single word, the number of bits that can be corrected using the described invention is 1 correction plus 2 detection, or a total of 3.

To achieve this level or correction for all possible locations of errors, it is further required that the error detecting and correcting code not misinterpret error counts within a single word up to the double word correction limit as a fault free condition. For the Hamming case, this means that triple errors in a single word must result in an indication that 1 or more errors was detected.

Figure 3:
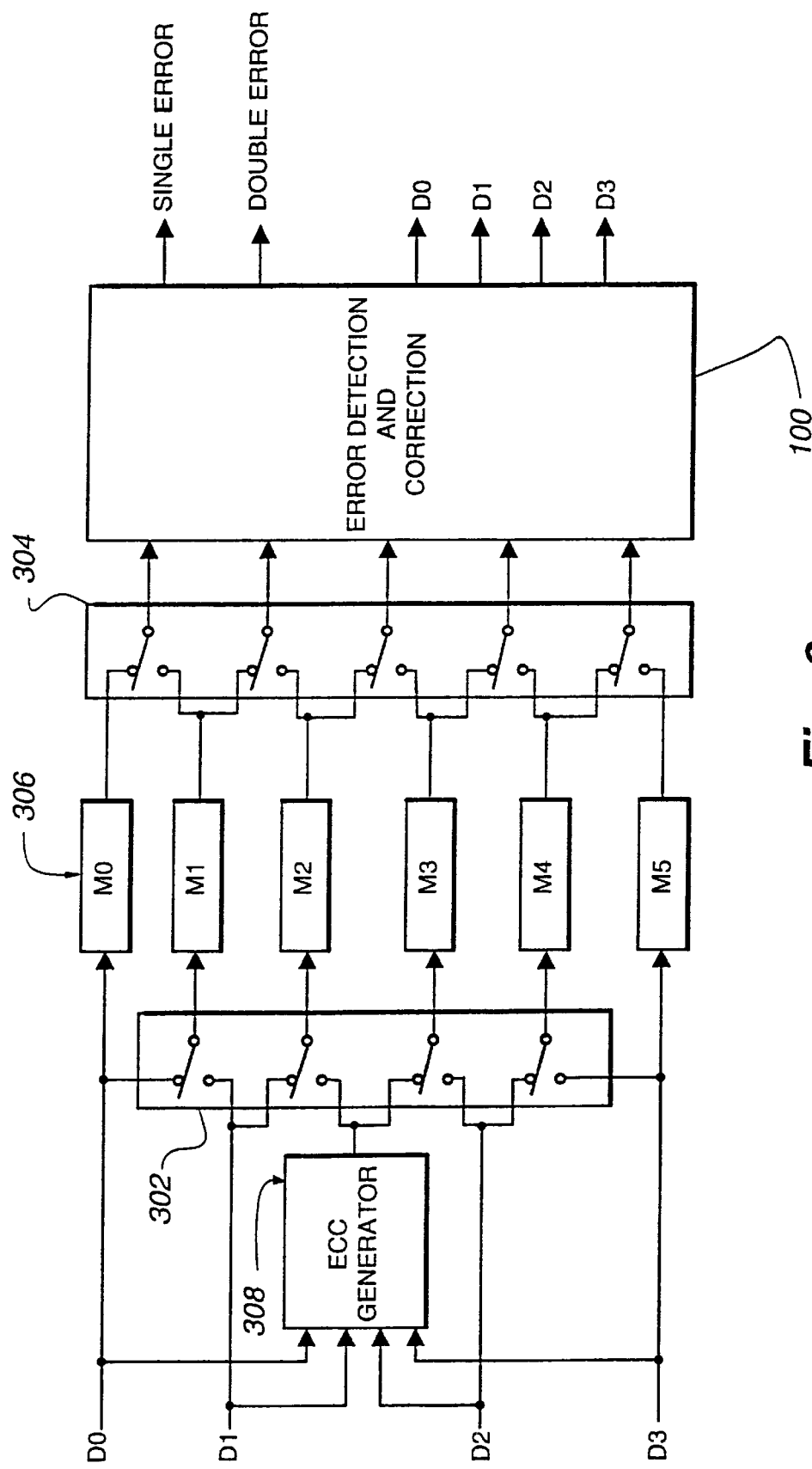
FIG. 3 illustrates a memory column sparing system in accordance with one embodiment of the present invention.

As shown in FIG. 3 and Table 3 (below), another feature of the present invention is an additional column or DRAM memory chips provided as spare memory in the event of an individual DRAM device failure. If a DRAM device fails, this spare memory can be used to replace the failed device, enhancing long term reliability. This mechanism can even circumvent shorts on data lines.

In accordance with a particular embodiment of the present invention, a set of software controllable multiplexers 302, 304 is provided between the plurality of memory chips 306, as shown in FIG. 3. These multiplexers control the selection of memory sparing modes of the memory system of the present invention. FIG. 3 shows four data bytes D0, D1, D2, and D3 (in one example, 8 bits/byte) for storage into the set of memory chips or devices M0, M1, M2, M3, M4, and M5. An error correction code (ECC) generator 308 is provided for encoding each four data byte stream with an error correction code prior to storage in the memory.

The multiplexers choose which 5 of the 6 accessible memory devices M0–M5 will be used for storing and retrieving data and the associated error correction code. A first multiplexer 302 is provided to select which memory chips M0–M5 are to be used for storing data. A second multiplexer 304 is provided to select from which memory chips the data should be read from. Both multiplexers can be configured by a software controllable register to ensure coordination between the write and read of data. As data is selectively read from M0–M5 through the second multiplexer, the data is then passed to the error detection and correction section 100 of the memory system, shown in FIG. 1 and described above, for decoding.

The set of memory chips and the data/ECC lines are arranged so that if one of the memory chips M0–M5 fails, the sparing mode can be dynamically altered so that the failed memory chip is bypassed and the remaining chips are used to provide memory to the computing system. Based on the configuration shown in FIG. 3, data is always written into every memory device, but the data read from the spare column is not used.

For writes of data to the memory system, the 4 data bytes of data D0, D1, D2, and D3 (32 bits) are presented to the ECC generation circuit 308, which produces an additional byte of ECC code. Based on the structure shown in FIG. 3, the data byte D0 is always written to the memory device M0, and the data byte D3 is always written to the memory device M5. Which data or ECC bytes are written into memory bytes M1–M4 is dependent on the input multiplexer 302 settings, which are controlled by a software accessible configuration register.

All 6 bytes of memory data are read, but the 5 bytes to be used for further processing are selected by the second multiplexer 304. As discussed above, the second multiplexer 304 is controlled by the same configuration register used for the write operation, assuring that writes and reads use the same sparing mode. The 5 selected bytes (D0–D4 plus the ECC byte) are further processed by the decoding section 100, described above with reference to FIG. 1, to detect and possibly correct bit errors that may have been introduced in the memory writing, storage, and reading processes.

Table 3 shows the possible configurations of the various memory sparing modes for data writes and reads. For the entries in Table 3 labeled "unused", the value in parentheses is the data written when the memory is written.

TABLE 3

Memory Sparing Modes

| | Physical Memory Column Contents | | | | | |
|---|---|---|---|---|---|---|
| Mode | M5 | M4 | M3 | M2 | M1 | M0 |
| 0 | D3 | D2 | ECC | D1 | D0 | Unused (D0) |
| 1 | D3 | D2 | ECC | D1 | Unused (D1) | D0 |
| 2 | D3 | D2 | ECC | Unused (ECC) | D1 | D0 |
| 3 | D3 | D2 | Unused (D2) | ECC | D1 | D0 |
| 4 | D3 | Unused (D3) | D2 | ECC | D1 | D0 |
| 5 | Unused (D3) | D3 | D2 | ECC | D1 | D0 |

Referring to Table 3, if, for example, memory device M3 fails, then sparing mode 3 can be dynamically selected so that M3 is not used for data storage and retrieval.

In a memory system that uses error correction codes, the present invention also provides for writing erroneous data or error checking codes into memory to allow the error detection and correction mechanism to be tested dynamically or on the fly. The correct generation of ECC bits can be directly checked dynamically by writing data in sparing mode 2. Data can then be read in sparing mode 0 or 1 to provide access to the ECC bits for verification. Further, to generate error indications, an ECC code can be placed in the D2 byte and the data word written using sparing mode 3. If the data is then read in sparing mode 2, the D2 data will be used as the ECC code, generating a fault indication if the ECC code is not correct.

In order to flexibly use the SECDED/TECQED modes and the memory sparing modes, multiple memory windows are also provided by one embodiment of the present invention. In one example, within the $2^{32}$ bit address space of a modern RISC processor, two or more address regions are set up. A typical size for these regions might be $2^{30}$, allowing up to four such regions to be available, although in practice only two might be used, with the rest of the address space used for input/output or other control functions. While these address regions access the same physical memory, they can have different settings based on the data mode and the sparing mode, thereby allowing the software of the computing system to flexibly manage the pool of physical memory.

Figure 4:
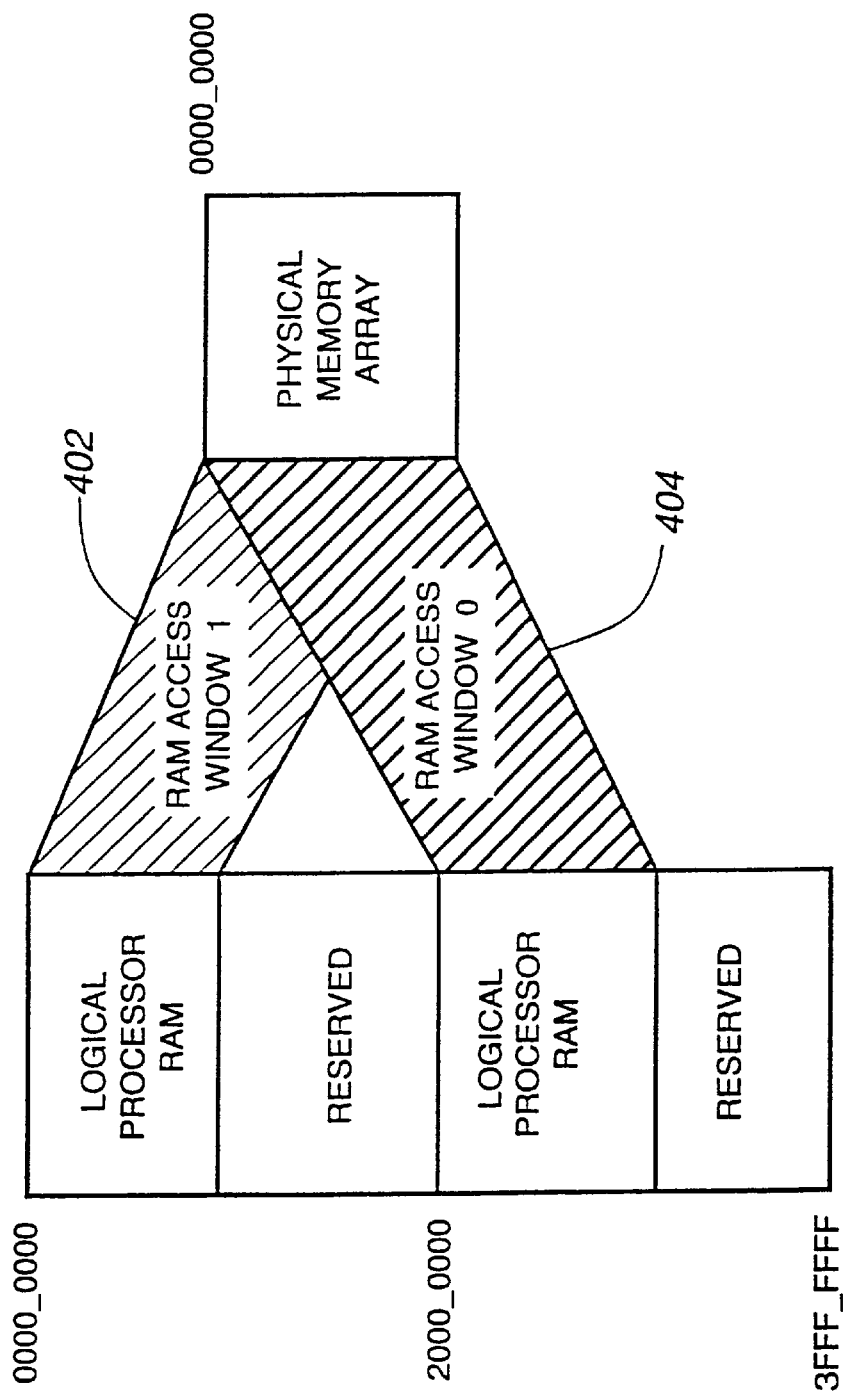
FIG. 4 illustrates a multiple memory window set having two memory address spaces within the logical address space of a processor to provide for operable error correction modes and memory column sparing in accordance with one embodiment of the present invention.

FIG. 4 shows two memory address spaces 402, 404 within the logical address space of a processor that access the same physical memory with possible different settings for memory column sparing and error detection and correction mode. Since error correction codes of the SECDED and TECQED modes use differing amounts of raw memory words to form computer data words (TECQED mode uses two memory words for each data word), the same physical memory word will have a different address in the two correction modes, as shown previously in FIG. 2. Table 4 shows the addressing for the two modes SECDED and TECQED. The memory address windows or aliases allow simultaneous access to the installed memory using two different combinations of error correcting mode and spare resource control settings.

TABLE 4

Addressing Relationships Among Data Modes

| Data Mode | Address of Nth Even Word | Address of Nth Odd Word |
|---|---|---|
| Interleaved | Base + 2 * N | Base + 2 * N + 1 |
| TECQED | | Base + N |
| Even Word | Base + N | n/a |
| Odd Word | n/a | Base + N |

Base = 0 × 0000_0000 for Memory Access Window 0 and 0 × 2000_0000 for Memory Access Window 1, for example.

For example, all the software program code could be accessed and stored using TECQED memory mode for greater security and reliability, and all data could be accessed through a second memory address region using SECDED mode to achieve a larger memory capacity and speed of access. Memory would be allocated to be used in the SECDED or TECQED mode when the software was compiled and logical addresses assigned to all program and data items.

With the memory system of the present invention, data can be moved freely between memory sparing modes by reading from one address space and writing to another. This enhances the ability of the computing system to work around failed memory segments, and to reconfigure memory while retaining as much access as possible to its previous contents.

Reading from one address space and writing to another address space will re-encode data error correction codes for future access through the second address space. However, reading data from one correction mode (i.e., SECDED) other than the one in which the data was written (i.e., TECQED) will generally result in garbled data. Table 3 can be used to understand what is happening to the data.

Figure 5:
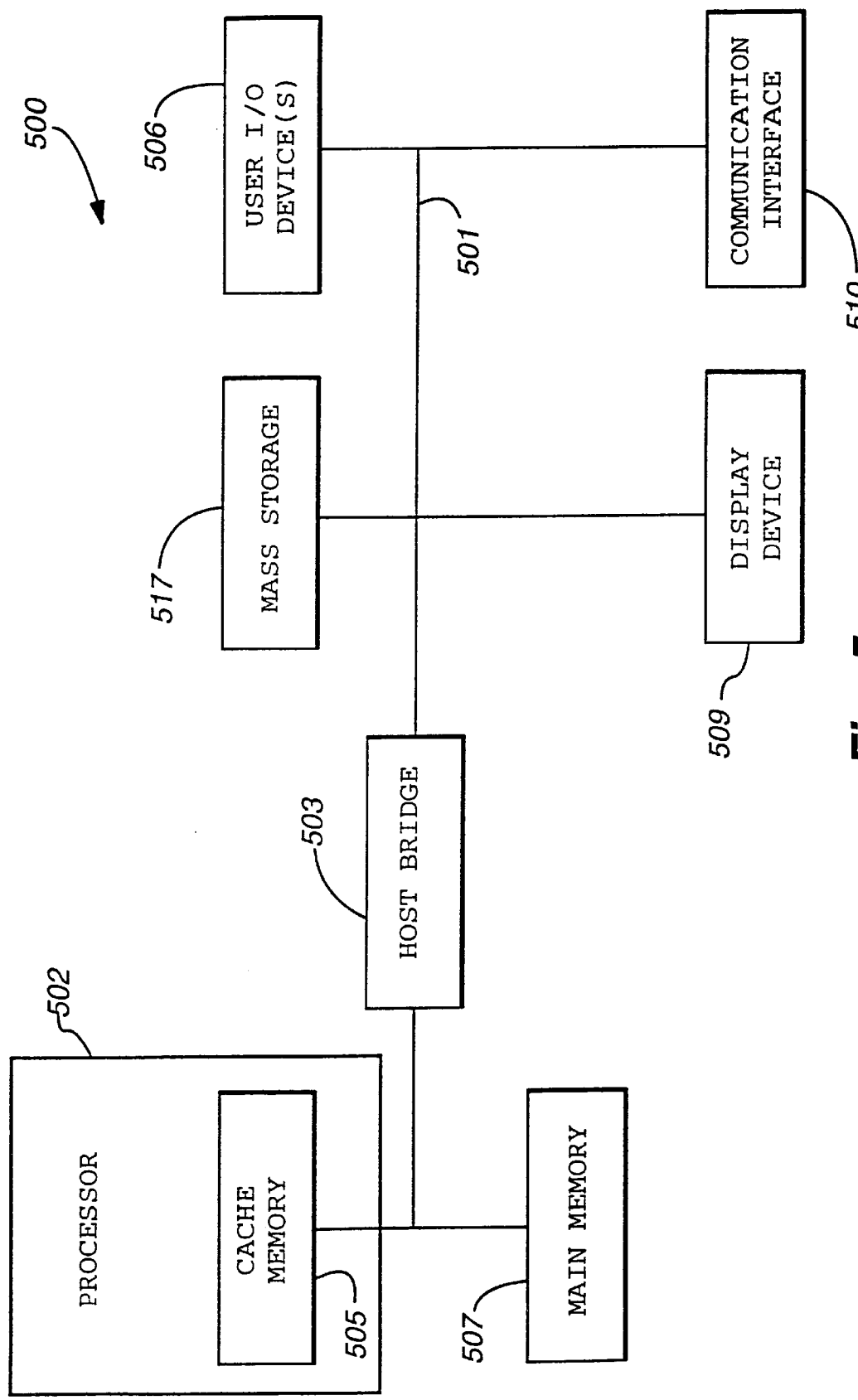
FIG. 5 illustrates in block diagram form a computer system in accordance with the present invention.

FIG. 5 illustrates a typical general purpose computer system 500 which can incorporate a memory system 507 in accordance with the present invention. Computer system 500 in accordance with the present invention comprises a system data bus 501 for communicating information, processor 502 coupled with bus 501 through a host bridge device 503 for processing data and executing instructions, and memory system 507 for storing information and instructions for processor 502. The memory system disclosed above can be used to enhance the reliability of memory system 507, and can be integrated on-chip with processor 502 or with external memory.

In a typical embodiment, processor 502, host bridge device 503, and some or all of cache memory 505 may be integrated in a single integrated circuit, although the specific components and integration density are a matter of design choice selected to meet the needs of a particular application.

User I/O devices 506 are coupled to bus 501 and are operative to communicate information in appropriately structured form to and from the other parts of computer 500. User I/O devices may include a keyboard, mouse, card reader, magnetic or paper tape, magnetic disk, optical disk, or other available input devices, including another computer. Mass storage device 517 is coupled to bus 501, and may be implemented using one or more magnetic hard disks, magnetic tapes, CDROMs, large banks of random access memory, or the like. Mass storage 517 may include computer programs and data stored therein.

In a typical computer system 500, processor 502, host bridge device 503, main memory system 507, and mass storage device 517, are coupled to bus 501 formed on a printed circuit board and integrated into a single housing. However, the particular components chosen to be integrated into a single housing is based upon market and design choices. Accordingly, it is expressly understood that fewer or more devices may be incorporated within a housing.

Display device 509 is used to display messages, data, a graphical or command line user interface, or other communications with the user. Display device 509 may be implemented, for example, by a cathode ray tube (CRT) monitor, liquid crystal display (LCD) or any available equivalent.

When used in conjunction with computing system 500, the memory system of present invention can improve the performance and reliability of the computing system as described above.

While the invention has been particularly shown and described with reference to a preferred embodiment thereof, it will be understood by those skilled in the art that various other changes in the form and details may be made without departing from the spirit and scope of the invention, as defined by the following claims.

We claim:

1. A memory, comprising:

at least one data storage device for storing encoded data wherein said encoded data is stored as a first copy of said encoded data and a second copy of said encoded data;

a first decoder for decoding said first copy of said encoded data, said first decoder detecting single bit errors present in said first copy and correcting said single bit errors by providing a corrected first copy of said first copy of said encoded data, said first decoder detecting double bit errors in said first copy;

a second decoder for decoding said second copy of said encoded data, said second decoder detecting single bit errors present in said second copy and correcting said single bit errors by providing a corrected second copy of said second copy of said encoded data, said second decoder detecting double bit errors in second copy;

a comparator for comparing said first corrected copy to said second corrected copy and generating an output signal indicating that said first corrected copy matches said second corrected copy; and control logic, responsive to said first and second decoders and the output signal of said comparator, for selecting between said first corrected copy or said second corrected copy as the data to be provided to a computing system.

2. The memory of claim 1, wherein said first and second decoders decode Hamming encoded data.

3. The memory of claim 1, wherein the control logic is configurable to operate in a first mode wherein said control logic provides correct data when the total number of bit errors in said first and second copies is three or less.

4. The memory of claim 3, wherein said control logic detects a data error when the total number of bit errors in said first and second copies is four.

5. The memory of claim 4, wherein the control logic is configurable to operate in a second mode wherein said control logic is bypassed.

6. The memory of claim 1, wherein the control logic indicates a data error when the first corrected copy does not match the second corrected copy.

7. The memory of claim 5, further comprising:
- a first access window corresponding to a first address range within the memory for storing data corresponding to the first mode; and
- a second access window corresponding to a second address range within the memory for storing data corresponding to the second mode.

8. A memory for storing data from data lines, comprising:
- an error correction code generator for generating error correction codes to be encoded with said data;
- a plurality of data storage devices comprising at least one data storage device for storing the error correction codes, at least one storage device for storing data from each data line, and at least one spare storage device;
- a first selector coupling said data lines and said error correction code generator to a selectable subset of said plurality of data storage devices so that data and the error correction codes are stored in the selectable subset of said plurality of data storage devices; and
- a second selector coupled to said plurality of data storage devices for selecting the subset of said plurality of data storage devices so that the data and the error correction codes stored in the selectable subset can be read therefrom, wherein said selectors are configurable to selectively access one of said plurality of memory devices containing the error correction codes.

9. The memory of claim 8, wherein said error condition code generator generates a Hamming code.

10. The memory of claim 9, wherein said error condition code generator generates a 7 bit Hamming code.

11. The memory of claim 8, wherein at least one of said plurality of memory devices comprises a DRAM device.

12. The memory of claim 8, wherein the first and second selectors are dynamically controllable by a software program.

13. A memory system for storing data from data lines, comprising:
- an error correction code generator for generating error correction codes to be encoded with said data;
- a plurality of data storage devices comprising at least one data storage device for storing the error correction codes, at least one storage device for storing data from each data line, and an additional spare storage device for use, wherein data is stored as a first copy and a second copy;
- a first selector coupling said data lines and said error correction code generator to a selectable subset of said plurality of data storage devices so that data and the error correction codes are stored in the selectable subset of said plurality of data storage devices;
- a second selector coupled to said plurality of data storage devices for selecting the subset of said plurality of data storage devices so that the data and the error correction codes stored in the selectable subset can be read therefrom;
- a first decoder for decoding said first copy of said data, said first decoder detecting single bit errors present in said first copy and correcting said single bit errors by providing a corrected first copy of said first copy of said data, said first decoder detecting double bit errors in said first copy;
- a second decoder for decoding said second copy of said data, said second decoder detecting single bit errors present in said second copy and correcting said single bit errors by providing a corrected second copy of said second copy of said data, said second decoder detecting double bit errors in second copy;
- a comparator for comparing said first corrected copy to said second corrected copy and generating an output signal indicating that said first corrected copy matches said second corrected copy; and
- control logic, responsive to said first and second decoders and the output signal of said comparator, for selecting between said first corrected copy or said second corrected copy as the data to be provided to a computing system.

14. The memory system of claim 13, wherein said error condition code generator generates a Hamming code.

15. The memory system of claim 14, wherein said error condition code generator generates a 7 bit Hamming code.

16. The memory system of claim 13, wherein at least one of said plurality of memory devices comprises a DRAM device.

17. A computer system, comprising:
- a processor formed on an integrated circuit chip;
- a memory system coupled to said processor for storing data from data lines, the memory system further comprising:
- at least one data storage device for storing encoded data wherein said encoded data is stored as a first copy of said encoded data and a second copy of said encoded data;
- a first decoder for decoding said first copy of said encoded data, said first decoder detecting single bit errors present in said first copy and correcting said single bit errors by providing a corrected first copy of said first copy of said encoded data, said first decoder detecting double bit errors in said first copy;
- a second decoder for decoding said second copy of said encoded data, said second decoder detecting single bit errors present in said second copy and correcting said single bit errors by providing a corrected second copy of said second copy of said encoded data, said second decoder detecting double bit errors in second copy;
- a comparator for comparing said first corrected copy to said second corrected copy and generating an output signal indicating that said first corrected copy matches said second corrected copy; and
- control logic, responsive to said first and second decoders and the output signal of said comparator, for selecting between said first corrected copy or said second corrected copy as the data to be provided to a computing system.

18. The computer system of claim 17, wherein said first and second decoders decode Hamming encoded data.

19. The computer system of claim 17, wherein the control logic is configurable to operate in a first mode wherein said control logic provides correct data when the total number of bit errors in said first and second copies is three or less.

20. The computer system of claim 17, further comprising:

an error correction code generator for generating error correction codes to be encoded with said data;

a plurality of data storage devices comprising at least one data storage device for storing the error correction codes, at least one storage device for storing data from each data line, and at least one spare storage device;

a first selector coupling said data lines and said error correction code generator to a selectable subset of said plurality of data storage devices so that data and the error correction codes are stored in the selectable subset of said plurality of data storage devices; and a second selector coupled to said plurality of data storage devices for selecting the subset of said plurality of data storage devices so that the data and the error correction codes stored in the selectable subset can be read therefrom, wherein said selectors are configurable to selectively access one of said plurality of memory devices containing the error correction codes.

* * * * *